United States Patent
Yang

(10) Patent No.: US 8,373,070 B2
(45) Date of Patent: Feb. 12, 2013

(54) METAL STRUCTURE OF FLEXIBLE MULTI-LAYER SUBSTRATE AND MANUFACTURING METHOD THEREOF

(75) Inventor: Chih-Kuang Yang, Hsin-Chu (TW)

(73) Assignee: Princo Middle East FZE, Dubai (AE)

( * ) Notice: Subject to any disclaimer, the term of this patent is extended or adjusted under 35 U.S.C. 154(b) by 271 days.

(21) Appl. No.: 12/830,321

(22) Filed: Jul. 4, 2010

(65) Prior Publication Data
US 2011/0088929 A1 Apr. 21, 2011

(30) Foreign Application Priority Data
Oct. 16, 2009 (TW) .............................. 98135202 A

(51) Int. Cl.
H05K 1/09 (2006.01)
G03F 7/20 (2006.01)

(52) U.S. Cl. ........ 174/255; 174/250; 174/254; 174/265; 361/748; 361/749; 361/760; 361/767; 257/752; 257/753; 257/764; 438/618; 438/631; 438/645; 29/832; 29/852

(58) Field of Classification Search .......... 174/251–267, 174/524, 527, 558; 361/762–767, 774, 780–795; 257/690, 738, 686, 778, 698, 732, 752, 753, 257/766, 737, E23.119; 438/672–675, 687, 438/613–621, 622, 666, 631, 645, 669, 634–640; 29/825–854
See application file for complete search history.

(56) References Cited

U.S. PATENT DOCUMENTS

| | | | | |
|---|---|---|---|---|
| 6,261,941 | B1 * | 7/2001 | Li et al. ......................... | 438/618 |
| 7,189,927 | B2 * | 3/2007 | Sakuyama ..................... | 174/261 |
| 7,294,929 | B2 * | 11/2007 | Miyazaki ....................... | 257/737 |
| 7,446,399 | B1 * | 11/2008 | Li .................................. | 257/669 |
| 2002/0162687 | A1 | 11/2002 | Akihiko | |
| 2003/0137056 | A1 | 7/2003 | Taniguchi et al. | |
| 2009/0188704 | A1 * | 7/2009 | Lee et al. ....................... | 174/255 |

FOREIGN PATENT DOCUMENTS

| | | |
|---|---|---|
| CN | 1671268 A | 9/2005 |
| CN | 101312620 A | 11/2008 |
| JP | 2005098861 A | 4/2005 |

* cited by examiner

*Primary Examiner* — Michail V Datskovskiy
(74) *Attorney, Agent, or Firm* — Cheng-Ju Chiang

(57) ABSTRACT

Disclosed is a metal structure of a multi-layer substrate, comprising a first metal layer and a dielectric layer. The first metal layer has an embedded base and a main body positioned on the embedded base. The base area of the embedded base is larger than the base area of the main body. After the dielectric layer covers the main body and the embedded base, the dielectric layer is opened at the specific position of the first metal layer for connecting the first metal layer with a second metal layer above the dielectric layer. When the metal structure is employed as a pad or a metal line of the flexible multi-layer substrate according to the present invention, the metal structure cannot easily be delaminated or separated from the contacted dielectric layer. Therefore, a higher reliability for the flexible multi-layer substrate can be achieved.

11 Claims, 6 Drawing Sheets

METAL STRUCTURE OF FLEXIBLE MULTI-LAYER SUBSTRATE AND MANUFACTURING METHOD THEREOF

BACKGROUND OF THE INVENTION

1. Field of the Invention

The present invention generally relates to a metal structure of a multi-layer substrate and the manufacturing method thereof, and more particularly to a metal structure of a flexible multi-layer substrate and the manufacturing method thereof.

2. Description of Prior Art

A multi-layer substrate can be utilized for manufacturing a package substrate, a printed circuit board, a flexible package substrate or a flexible printed circuit for realizing miniaturization of all electronic products is an inevitable trend in this modern world. Particularly, a flexible multi-layer substrate can be utilized for manufacturing a flexible package structure to apply in kinds of products to meet miniaturization demands more efficiently. As the thickness of the flexible multi-layer substrate gets thinner, the routing density of the multi-layer substrate becomes higher. Accordingly, the requirements of the metal structure size of the flexible multi-layer substrate become smaller and more meticulous. Traditional flexible multi-layer substrates according to prior arts can only be manufactured with two or three layers. The thickness of each layer is about 50~60 μm and the thickness of the metal layer is about 30 μm.

Please refer to FIG. 1, which depicts a diagram showing a bubble generated at a side of a metal structure of a multi-layer substrate according to prior arts. The multi-layer substrate according to prior arts can be flexible comprises a metal layer 100 and a dielectric layer 102 covering the metal layer 100. Generally, an etching or a build-up process is utilized to form the metal layer 100 of the flexible multi-layer substrate according to prior arts. When the metal layer 100 is employed as a metal line or a pad, the sectional appearance of the metal layer 100 shows a rectangular figure. A common problem which often occurs is that a bubble generated at the side the metal layer 100. As shown in FIG. 1, a phenomenon of bad adhesion or delamination in layers exists due to the bubble. As a result, a lower manufacturing yield of the flexible multi-layer substrate happens. Particularly, as the metal layer 100 becomes thinner as along as the thickness of the flexible multi-layer substrate gets thinner, the influence of the aforesaid phenomenon of bad adhesion or delamination in layers unavoidably turns to more obvious.

Please refer to FIG. 2, which depicts a diagram showing a metal structure of a multi-layer substrate stripped off with a ball mount due to an external force according to prior arts. As aforementioned, as the metal layer 100 is employed as a metal line or a pad, the sectional appearance of the metal layer shows a rectangular figure. As the metal layer 100 is utilized as a metal layer for package of an IC (Integrated Circuit), the dielectric layer 102 covering the metal layer 100 above is going to be opened a hole and a metal material 106 is formed in for connecting with the solder ball mount 108. As previously mentioned, the flexible multi-layer substrate is utilized as a flexible package substrate or a flexible printed circuit. Generally, it is applied for a constantly bent device. Namely, when the flexible multi-layer substrate is bent, the metal layer 100 may be stripped off with the solder ball mount 108 due to a bending external force as shown in FIG. 2 because the bonding strength between the metal layer 100 and the solder ball mount 108 is too strong. Similarly, as the metal layer 100 becomes thinner as along as the thickness of the flexible multi-layer substrate gets thinner, the aforesaid stripped-off phenomenon unavoidably becomes more possible and happens more easily.

In conclusion, there is a need to develop a metal structure of a flexible multi-layer substrate and manufacturing method which is still valid for resolving the aforesaid problems when the thickness of the flexible multi-layer substrate is manufactured thinner and accordingly the metal layer also has to be thinner, wherein the metal structure cannot easily be delaminated or separated from the contacted, adjacent dielectric layers and a higher reliability of the metal structure can be achieved.

SUMMARY OF THE INVENTION

An objective of the present invention is to provide a metal structure of a multi-layer substrate and manufacturing method thereof. The metal structure of the present invention can be employed as a pad or a metal line in a thin, flexible multi-layer substrate in which delamination and separation from the contacted dielectric layers cannot easily happen.

Another objective of the present invention is to provide a metal structure of a multi-layer substrate and manufacturing method thereof. Especially, for a flexible substrate package to a general IC (a hard, firm IC), the metal structure of the present invention can allow the thin, flexible multi-layer substrate to be utilized for a constantly bent device and achieving a higher reliability.

The metal structure of a multi-layer substrate of the present invention comprises a first metal part and a dielectric layer. The first metal part has an embedded base and a main body positioned on the embedded base. The base area of the embedded base is larger than the base area of the main body. The dielectric layer covers the embedded base and the main body and has a hole at a specific position of the first metal part. Therefore, the first metal part can connect with a second metal part above the dielectric layer. The main body and the embedded base can be monolithic formed. The main body and the embedded base can be formed by the same material or different material. Alternatively, the main body and the embedded base can be formed by different processes. A first process is to form the embedded base and then, a second process is to form the main body on the embedded base thereafter.

The present invention also provides a manufacturing method of a metal structure of a flexible multi-layer substrate. The manufacturing method comprises steps below:

coating at least one photoresist layer on a first dielectric layer;

proceeding a photolithography process to the photoresist layer to define a specific position for a first metal part;

removing the photoresist layer at the specific position; and forming the first metal part at the specific position, wherein a base area of the first metal part is larger than a top area thereof to form the metal structure having an embedded base and a main body positioned thereon.

The present invention further provides another manufacturing method of the metal structure of the multi-layer substrate. The manufacturing method comprises steps below:

coating a first photoresist layer on a first dielectric layer;

proceeding a photolithography process to the first photoresist layer to define a first specific position for a first metal part;

removing the first photoresist layer at the first specific position;

forming an embedded base of the first metal part;

coating a second photoresist layer after removing the first photoresist layer on the first dielectric layer;

proceeding a photolithography process to the second photoresist layer to define a second specific position for the first metal part;

removing the second photoresist layer at the second specific position; and forming a main body of the first metal part on the embedded base and a base area of the embedded base is larger than a base area of the main body.

Specifically, the metal structure of the multi-layer substrate according to the present invention can be flexible and not only applied in the field of package substrates. Meanwhile, the present invention also can be applied in the technical field of manufacturing print circuit boards and flexible package substrates. Significantly, the manufacturing method of the present invention attends to provide a metal structure comprising an embedded base and a main body. When the second dielectric layer is formed to cover thereon, such a metal structure of the thin and flexible multi-layer substrate cannot easily be delaminated or separated from the contacted, adjacent dielectric layers. The metal structure of the present invention employed as a pad or a metal line of the thin and flexible multi-layer substrate can achieve a higher reliability.

DETAILED DESCRIPTION OF THE INVENTION

Figure 1:
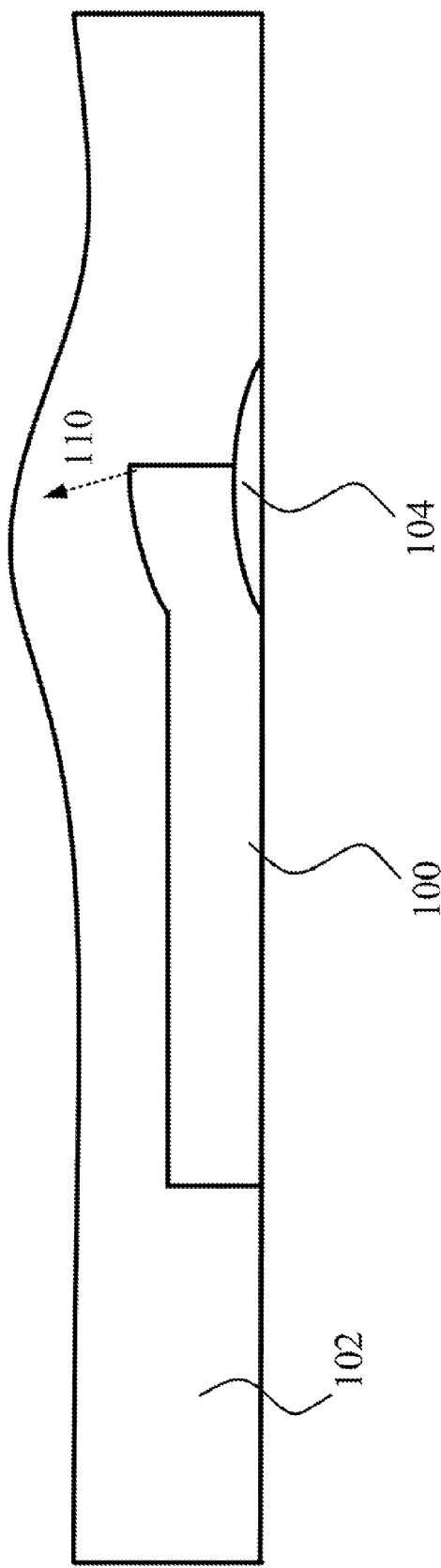
FIG. 1 depicts a diagram showing a bubble generated at a side of a metal structure of a multi-layer substrate according to prior arts.
Figure 2:
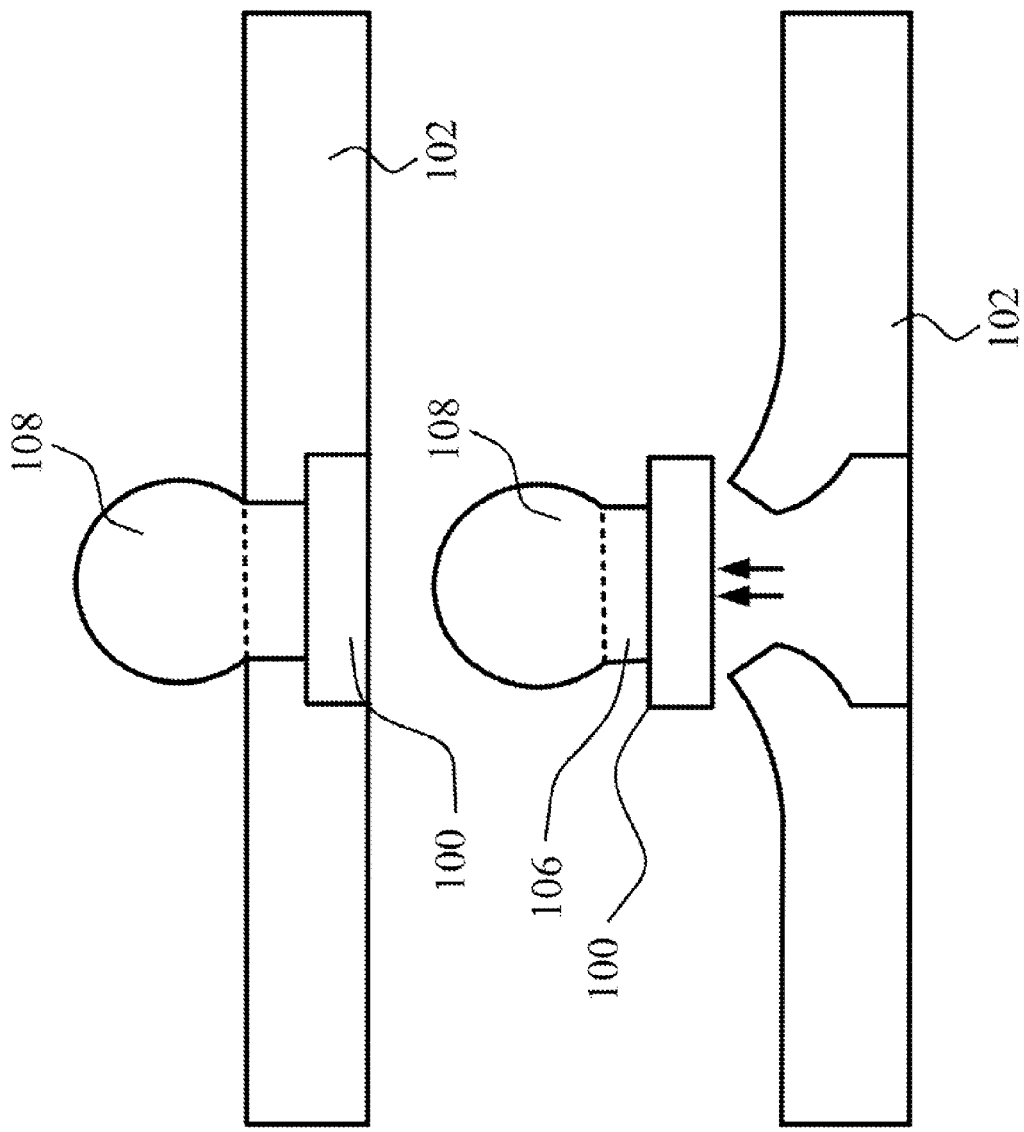
FIG. 2 depicts a diagram showing a metal structure of a multi-layer substrate stripped off with a ball mount due to an external force according to prior arts.
Figure 3:
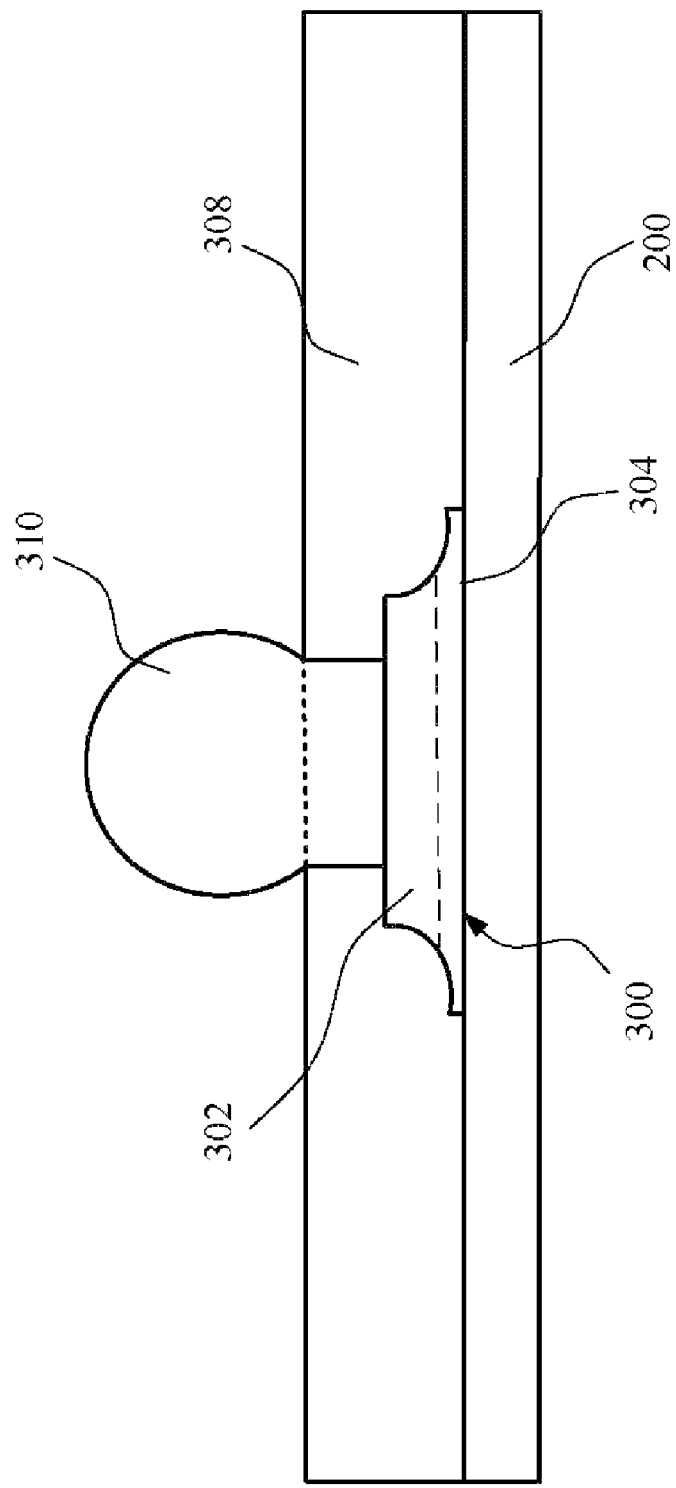
FIG. 3 depicts a diagram of a first embodiment of a metal structure of a multi-layer substrate according to the present invention.

Please refer to FIG. 3, which depicts a diagram of a first embodiment of a metal structure of a multi-layer substrate according to the present invention. In the first embodiment, the metal structure of the multi-layer substrate is employed as a pad and the multi-layer substrate can be flexible and utilized to package an IC (Integrated Circuit, not shown). The metal structure of the flexible multi-layer substrate comprises a first metal part 300 and a second dielectric layer 308. The first metal part 300 comprises a main body 302 and an embedded base 304. The flexible multi-layer substrate further comprises a first dielectric layer 200 under the main body 302 and the embedded base 304. As shown in FIG. 3, the main body 302 is on the embedded base 304 and a base area of the embedded base 304 is larger than a base area of the main body 302. The second dielectric layer 308 covers the embedded base 304 and the main body 302. After the second dielectric layer 308 is covered, the embedded base 304 is clamped by the first dielectric layer 200 and the second dielectric layer 308.

A hole of the second dielectric layer 308 is formed on the specific position of the main body 302 to allow the main body 302 connect with the solder ball mount 310 for package of an IC (not shown in FIG. 3). If a bubble generates at one side of the first metal part 300, the embedded base 304 can reduce the affect of the phenomenon of bad adhesion or delamination in layers caused by the bubble. Moreover, although the adhesion between the first metal part 300 and the first dielectric layer 200 has certain strength. The issue that the first metal part 300 is stripped off with the solder ball mount 310 from the multi-layer substrate due to a bending external force can be efficiently prevented because the present invention utilizes the clamped strength of the embedded base 304 by the first dielectric layer 200 and the second dielectric layer 308. Especially, as the multi-layer substrate of the present invention can be flexible and manufactured up to six, seven layers, or even 10 layers, and the thickness of each layer can be so thin about 10 μm. The thickness of the first metal part 300 is even merely about 5 μm which is far thinner than the possible thickness made by prior arts. It's totally necessary to avoid the foregoing phenomenons of the bubble generated at the side of the metal structure, bad adhesion or delamination in layers. In this embodiment, though, the metal structure is employed as a pad of the flexible multi-layer substrate. Similarly, as the metal structure is employed as a metal line in the flexible multi-layer substrate and connects with another metal line above through a via, the aforesaid phenomenons of bad adhesion or delamination in layers also can be prevented. Accordingly, the metal structure of the flexible multi-layer substrate according to the present invention can solve the problems of prior arts and efficiently promote the reliability of the flexible multi-layer substrate.

Figure 4:
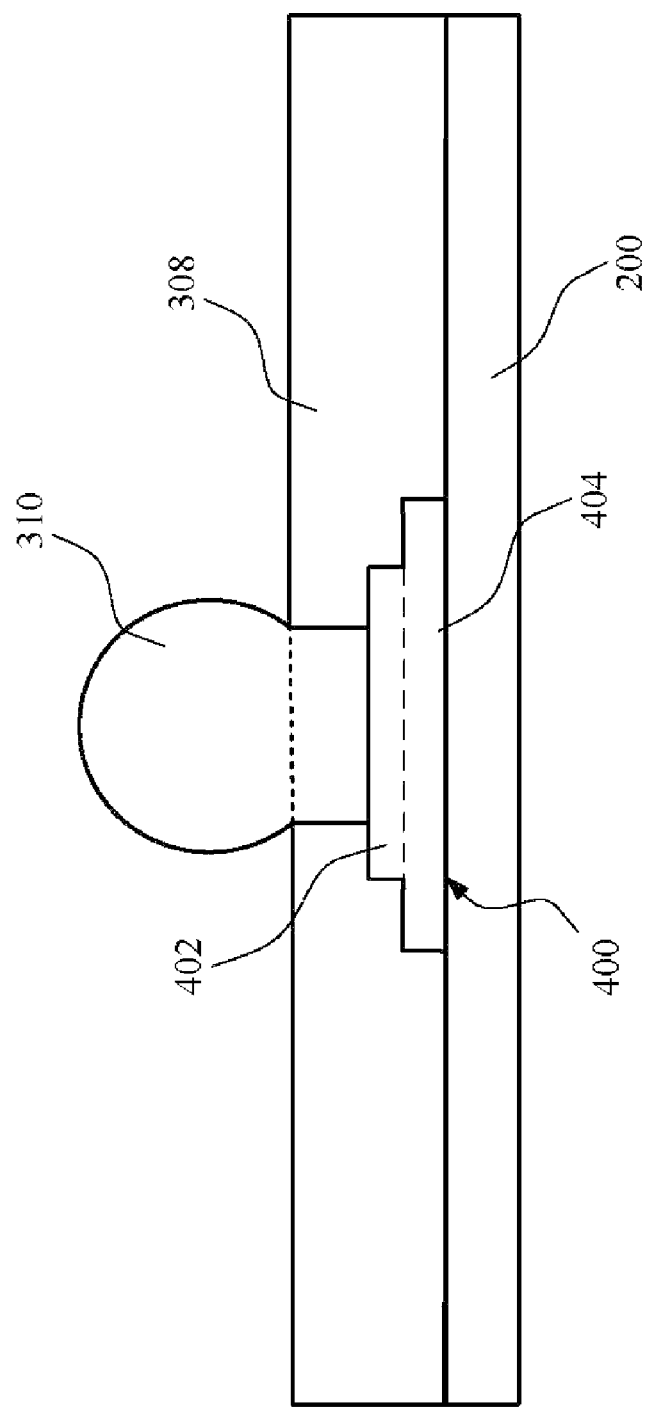
FIG. 4 depicts a diagram of a second embodiment of a metal structure of a multi-layer substrate according to the present invention.

Please refer to FIG. 4, which depicts a diagram of a second embodiment of a metal structure of a multi-layer substrate according to the present invention. In the second embodiment, the metal structure can be flexible and also employed as a pad. The flexible multi-layer substrate is utilized for package of an IC (Integrated Circuit, not shown). The metal structure of the flexible multi-layer substrate comprises a first metal part 400 and a second dielectric layer 308. The first metal part 400 comprises a main body 402 and an embedded base 404. The flexible multi-layer substrate further comprises a first dielectric layer 200 under the main body 402 and the embedded base 404. As shown in FIG. 4, the main body 402 is on the embedded base 404 and a base area of the embedded base 404 is larger than a base area of the main body 402. The second dielectric layer 308 covers the embedded base 404 and the main body 402. After the second dielectric layer 308 is covered, the embedded base 404 is clamped by the first dielectric layer 200 and the second dielectric layer 308. A hole of the second dielectric layer 308 is formed on the main body 402 for connecting with the solder ball mount 310 for package of an IC (not shown in FIG. 4).

As shown in FIG. 4, the difference of the second embodiment from the first embodiment is that the main body 402 and the embedded base 404 can be formed by the same metal material or different metal materials. Moreover, the main body 402 and the embedded base 404 can be monolithic formed like the first embodiment. In the second embodiment, the embedded base 404 is formed first and then, the main body 402 can be formed on the embedded base 404 by two processes. Similarly, the metal structure in the second embodiment also can be employed as a metal line in the flexible multi-layer substrate and connects with another metal line above.

The second embodiment of the present invention also can reduce the affect of the phenomenons of delamination or separation in layers caused by the bubble generated at one side of the first metal part 400 or the phenomenons of bad adhesion, delaminated or separated in layers from the contacted, adjacent dielectric layers. Therefore, the metal structure of the flexible multi-layer substrate according to the present invention is capable of resolving the problems of prior arts. The metal material for forming the metal parts in the first embodiment, and the second embodiment can be copper. The material for forming dielectric layers can be polyimide.

Figure 5:
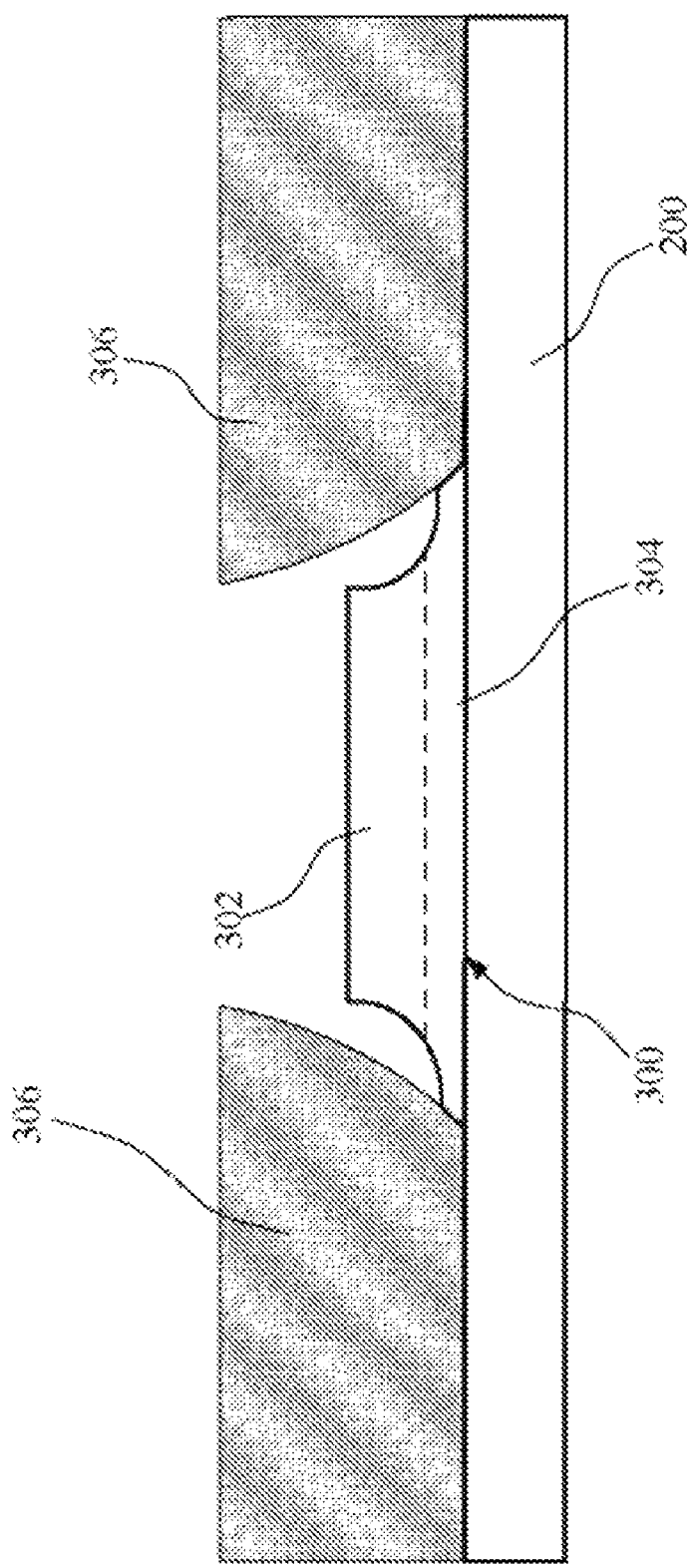
FIG. 5 depicts a diagram for explaining a manufacturing method for the first embodiment of the metal structure of the multi-layer substrate according to the present invention.

Please refer to FIG. 5, which depicts a diagram for explaining a manufacturing method for the first embodiment of the metal structure of the multi-layer substrate according to the present invention. Please also refer to FIG. 3 at the same time. The manufacturing method of the metal structure of the flexible multi-layer substrate according to the present invention comprises the steps below.

A negative photoresist layer 306 is coated on a first dielectric layer 200. A photolithography process is proceeded to the negative photoresist layer 306 to define a specific position of the first metal part 300. Then, the negative photoresist layer 306 at the specific position is removed (such as a developing process). Because the top of the negative photoresist layer 306 receives more light than the bottom, the fringe of the negative photoresist layer 306 adjacent to the specific position is formed a top-protruding appearance as shown in FIG. 5. After that, the first metal part 300 having a main body 302 and an embedded base 304 is formed by physical vapor deposition, like vacuum evaporation, at the specific position as shown in FIG. 5. Moreover, due to the top-protruding appearance of the negative photoresist layer 306, the embedded base 304 of the first metal part 300 can extend out to reach the bottom of the negative photoresist layer 306 when the first metal part 300 is formed. As shown in FIG. 5, a base area is larger than a top area of the first metal part 300, i.e. the base area (or the occupied area) of the embedded base 304 is larger than a base area (or the occupied area) of the main body 302.

As shown in FIG. 3, after the negative photoresist layer 306 is removed, the second dielectric layer 308 covers the main body 302 and the embedded base 304 of the first metal part 300. The embedded base 302 is now clamped by the first dielectric layer 200 and the second dielectric layer 308. After that, a via of the second dielectric layer 308 is opened at the specific position of the first metal part 300. The first metal part 300 can be connected with a second metal part (such as a solder ball mount 310 or another metal line). If the first metal law part 300 is employed as a pad, and will connect with the solder ball mount 310 for package. If the first metal part 300 is employed as a metal line, and will connect with another metal line to realize an interconnection of the flexible multi-layer substrate.

Figure 6:
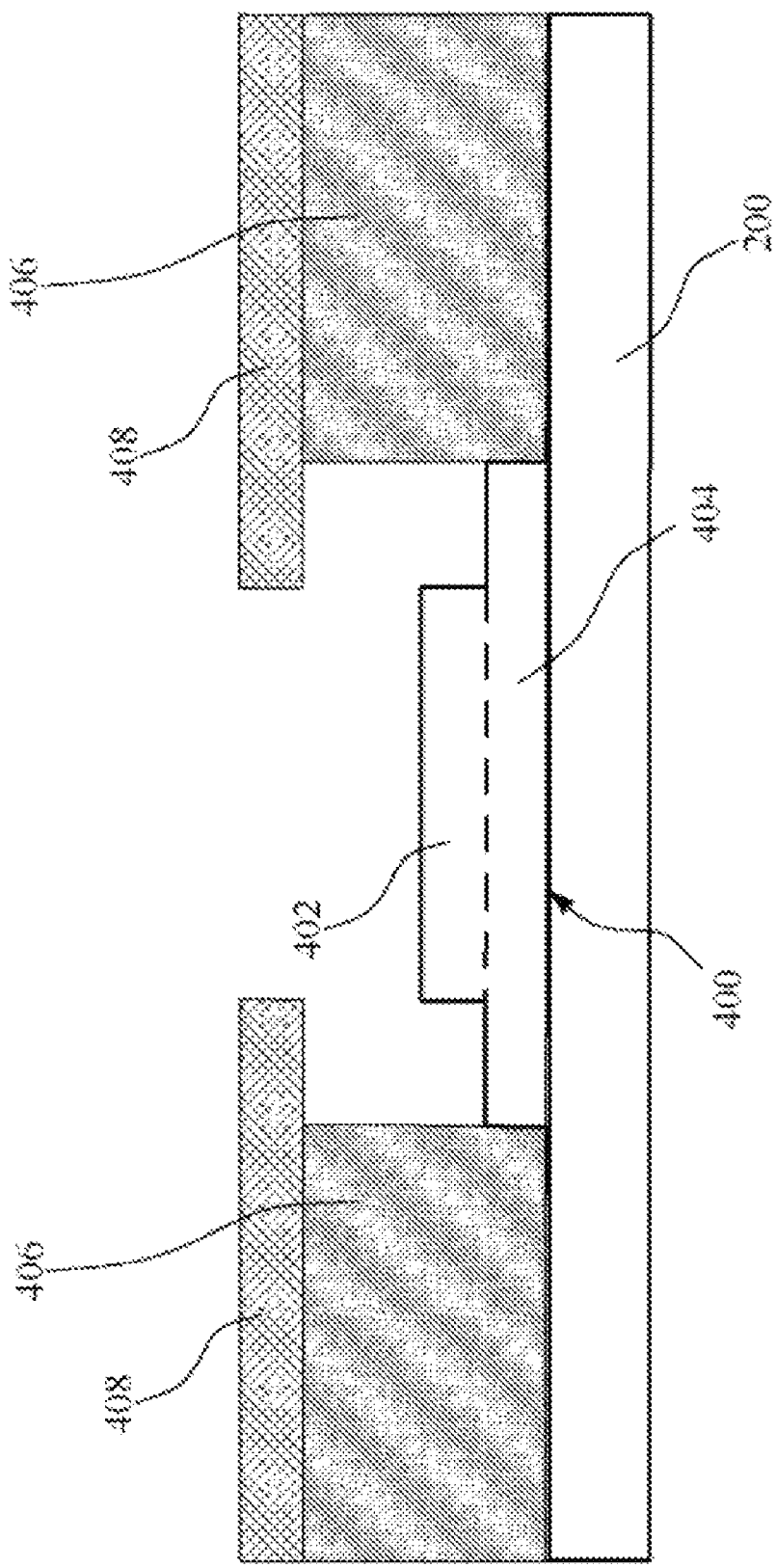
FIG. 6 depicts a diagram for explaining a manufacturing method for the second embodiment of the metal structure of the multi-layer substrate according to the present invention.

Please refer to FIG. 6, which depicts a diagram for explaining a manufacturing method for the second embodiment of the metal structure of the multi-layer substrate according to the present invention. The second embodiment of the metal structure according to the present invention can have two manufacturing methods. In one manufacturing method, at least two photoresist layers with different photolithography rates, such as a bottom photoresist layer 406 and a top photoresist layer 408 are formed are coated. The bottom photoresist layer 406 and the top photoresist layer 408 can be both positive photoresist or both negative photoresist. Then, a photolithography process is proceeded to the bottom photoresist layer 406 and the top photoresist layer 408 at the same time but due to the different photolithography rates of the bottom photoresist layer 406 and the top photoresist layer 408, respective holes s with different sizes are formed as shown in FIG. 6. The hole of the bottom photoresist layer 406 is larger than the hole of the top photoresist layer 408. Accordingly, as the first metal part 400 is manufactured by physical vapor deposition, like vacuum evaporation, a metal structure having a main body 402 and an embedded base 404 is formed. Same metal material can be utilized to form the main body 402 and the embedded base 404 in the manufacturing method of the present invention.

Please also refer to FIG. 4 with FIG. 6, as the second embodiment of the metal structure is manufactured with another manufacturing method, the manufacturing method of the metal structure of the multi-layer substrate according to the present invention comprises the steps below.

A first photoresist layer 406 is coated on a first dielectric layer 200. A photolithography process is proceeded to the first photoresist layer 406 to define a first specific position for the first metal part 400. Then, the first photoresist layer 406 at the first specific position is removed (such as a developing process). The embedded base 404 of the first metal part 400 is formed by physical vapor deposition, like vacuum evaporation, at the first specific position. A second photoresist layer 408 is coated after the rest first photoresist layer 406 is removed. A photolithography process is proceeded to the second photoresist layer 408 at a second specific position of the first metal part 400. Then, the second photoresist layer 408 is at the second specific position is removed (such as a developing process). Meanwhile the hole of the second photoresist layer 408 is controlled to be smaller than the hole of the first photoresist layer 406. After that, the main body 402 is formed on the embedded base 404. A metal structure which a base area of the embedded base 404 is larger than a base area of the main body 402 is completed. Alternatively, forming the embedded base 404 and the main body 402 by etching also can be illustrated. In this case, the step of forming the embedded base 404 and the main body 402 of the first metal part 400 is proceeded in advance. Then, coating the first photoresist layer 406 or the second photoresist layer 408 at the first specific position and the second specific position is proceeded for covering the first metal part 400. With one or two etching steps, the first metal part 400 except the position of the first photoresist layer 406 and the position of the second photoresist layer 408 can be removed and the same embedded base 404 and the main body 402 shown in FIG. 6 can be obtained.

As shown in FIG. 4, the second dielectric layer 408 covers the main body 402 and the embedded base 404 of the first metal part 400. The embedded base 402 is now clamped by the first dielectric layer 200 and the second dielectric layer 408. After that, a via of the second dielectric layer 408 is opened at the specific position of the first metal part 400. The first metal part 400 can be connected with a second metal part (such as a solder ball mount 310 or another metal line). If the first metal part 400 is employed as a pad, and will connect with the solder ball mount 310 for package. If the first metal part 400 is employed as a metal line, and will connect with another metal line to realize an interconnection of the flexible multi-layer substrate. According to the present invention, the embedded base 404 is formed first and then, the main body 402 can be formed on the embedded base 404 by two independent processes. The main body 402 and the embedded base 404 can be formed by the same metal material. Alternatively, the main body 402 and the embedded base 404 also can be formed by two different metal materials.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A metal structure of a multi-layer substrate, comprising:
a first metal part, having an embedded base and a main body positioned on the embedded base, wherein a base area of the embedded base is larger than a base area of the main body; and
a dielectric layer, covering the embedded base and the main body and having a hole at a specific position of the first metal part to connect with a second metal part above the dielectric layer, wherein the main body and the embedded base are monolithic formed.

2. The metal structure of claim 1, wherein the main body and the embedded base of the first metal part are formed at the same process.

3. The metal structure of claim 1, wherein the main body and the embedded base are formed by the same metal material.

4. The metal structure of claim 1, wherein the multi-layer substrate is flexible.

5. The metal structure of claim 1, wherein a material of the first metal part is copper.

6. The metal structure of claim 1, wherein a material of the second metal part is solder.

7. The metal structure of claim 1, wherein a material of the dielectric layer is polyimide.

8. The metal structure of claim 1, wherein the first metal part is employed as a pad of the flexible multi-layer substrate.

9. The metal structure of claim 8, wherein the second metal part is a solderball mount for package.

10. The metal structure of claim 1, wherein the first metal part is employed as a metal line in the flexible multi-layer substrate.

11. The metal structure of claim 10, wherein the dielectric layer is polyimide.

* * * * *